(12) United States Patent
Sha et al.

(10) Patent No.: US 12,422,494 B2
(45) Date of Patent: Sep. 23, 2025

(54) METHOD FOR CONTROLLING BATTERY POWER INTERFACE CONVERTER WITH ULTRA-WIDEBAND EIS MEASUREMENT FUNCTION

(71) Applicant: Southwest Jiaotong University, Chengdu (CN)

(72) Inventors: Jin Sha, Chengdu (CN); Gaofeng Qiu, Chengdu (CN); Yuebing Sun, Chengdu (CN); Jinsong Shen, Chengdu (CN); Haitao Hu, Chengdu (CN); Zhaoyang Zhao, Chengdu (CN); Anqi Geng, Chengdu (CN)

(73) Assignee: Southwest Jiaotong University, Chengdu (CN)

( * ) Notice: Subject to any disclaimer, the term of this patent is extended or adjusted under 35 U.S.C. 154(b) by 0 days.

(21) Appl. No.: 18/423,000

(22) Filed: Jan. 25, 2024

(65) Prior Publication Data
US 2025/0231249 A1    Jul. 17, 2025

(30) Foreign Application Priority Data

Nov. 14, 2023   (CN) .......................... 202311513345.2

(51) Int. Cl.
*G01R 31/389* (2019.01)
*H02J 3/10* (2006.01)
*H02J 7/00* (2006.01)

(52) U.S. Cl.
CPC .............. *G01R 31/389* (2019.01); *H02J 3/10* (2013.01); *H02J 7/00711* (2020.01)

(58) Field of Classification Search
CPC ........ G01R 31/389; H02J 3/10; H02J 7/00711
(Continued)

(56) References Cited

U.S. PATENT DOCUMENTS 10,145,660 B1 * 12/2018 Fluhler ................. H01Q 21/24
10,361,455 B2 * 7/2019 Allenic ............... H01M 50/409
(Continued)

FOREIGN PATENT DOCUMENTS

CA           3206682  A1 * 8/2022 ........... G01R 31/367
CN        108431231  A  * 8/2018 ............... C12Q 1/00
(Continued)

*Primary Examiner* — M Baye Diao
(74) *Attorney, Agent, or Firm* — Nitin Kaushik (57) ABSTRACT

The present disclosure is a method for controlling a battery power interface converter with an ultra-wideband EIS measurement function. According to the present disclosure, a discrete pulse control method based on discrete pulse modulation is adopted, which, by generating two discrete duty ratio signals and according to a relationship between a battery charging current and a reference current, selects an appropriate duty ratio signal from the two discrete duty ratio signals to generate a control pulse signal to act on the battery power interface converter. The method of the present disclosure achieves accurate tracking of the output current of the power interface converter to DC charging or ultra-wideband hybrid reference current. A battery charging control system can achieve a normal constant-current charging function while operating in a constant-current charging mode and the ultra-wideband EIS of a battery accurate measurement function in an EIS measurement mode.

8 Claims, 4 Drawing Sheets

(58) Field of Classification Search
USPC .......................................................... 320/139
See application file for complete search history.

(56) References Cited

U.S. PATENT DOCUMENTS

| | | | |
|---|---|---|---|
| 11,275,121 B2* | 3/2022 | Kondo | G01R 31/3835 |
| 11,609,274 B2* | 3/2023 | Zhang | H02J 7/00711 |
| 11,719,755 B2* | 8/2023 | Pressas | G01R 31/3842 |
| | | | 324/430 |
| 12,176,497 B2* | 12/2024 | Ghantous | H02J 7/0047 |
| 2013/0200840 A1* | 8/2013 | Chen | H02J 7/007182 |
| | | | 320/134 |
| 2024/0310446 A1* | 9/2024 | Leduc | H01M 10/482 |

FOREIGN PATENT DOCUMENTS

| | | | | |
|---|---|---|---|---|
| CN | 110401346 A | | 11/2019 | |
| CN | 116455234 A | | 7/2023 | |
| CN | 116667681 A | | 8/2023 | |
| GB | 2385134 A | * | 8/2003 | ........... A61B 5/0534 |
| JP | 2023022170 A | * | 2/2023 | ......... A61B 5/02007 |
| KR | 20230043779 A | * | 3/2023 | ......... A61B 5/14546 |
| KR | 20240005085 A | * | 1/2024 | ........... A61B 5/7225 |

* cited by examiner

METHOD FOR CONTROLLING BATTERY POWER INTERFACE CONVERTER WITH ULTRA-WIDEBAND EIS MEASUREMENT FUNCTION

CROSS-REFERENCE TO RELATED APPLICATIONS

The application claims priority to Chinese patent application No. 2023115133452, filed on Nov. 14, 2023, the entire contents of which are incorporated herein by reference.

TECHNICAL FIELD

The present disclosure relates to the technical field of power electronics, and more particularly, to a method for controlling a battery power interface converter with an ultra-wideband EIS measurement function.

BACKGROUND

Electrochemical batteries are becoming increasingly important in a variety of applications such as portable electronic devices, electric vehicles, commercial renewable energy systems and smart grids, as the level of science and technology continues to improve and the demand for energy in society grows. Therefore, the diagnosis of the battery lifetime and safety has become a key issue in the field of battery applications. Electrochemical impedance spectroscopy (EIS) is one of the most commonly used methods for battery state assessment and diagnosis. In this method, EIS is obtained by measuring AC complex impedance values of the battery within a certain frequency range, which serves to reflect the electrochemical process in the battery, and hereby to evaluate performance indicators of the battery, such as temperature, state of charge, state of health, etc. Therefore, it is of great significance to study the measurement of the EIS of the battery.

In a laboratory, additional instrumentation equipment is often used to measure the EIS of the battery, and such external measurement devices are bulky and expensive, and need to be operated in an offline testing environment, resulting in inconvenient measurement and the inability to measure the EIS online in real time. Therefore, a simple, low-cost solution that can implement online real-time EIS measurement needs to be designed. Therefore, a battery power interface converter is used to generate an AC disturbance which is superimposed on the dc charging current of the battery, and finally the EIS of the battery is calculated based on the AC components of its current and voltage, thereby achieving embedded battery EIS measurement. That is, the EIS of the battery can be measured online while the battery is charged. This embedded EIS measurement method requires the battery power interface converter to accurately track a hybrid signal composed of a DC charging current signal and tiny wideband AC disturbance signals, which challenges a control technology for the battery power interface converter. Therefore, it is important to investigate a suitable control technology and apply it to the battery power interface converter.

At present, the control technologies applied to the battery interface converter include proportional-integral (PI) control, proportional-integral-resonance (PI-R) control, modeling predicative control (MPC), etc. Traditional PI control has the problem of bandwidth limitation, and fails to track and control high-frequency disturbance signals. Although PI-R control improves the tracking accuracy of a specific disturbance signal by achieving a large gain around the resonance frequency spectrum, it still cannot track the disturbance signals in a wide frequency range. MPC control, on the other hand, has shortcomings such as complex control implementation and substantial computational requirements, and the tracking effect of high-frequency disturbed signals is not ideal. In summary, the existing control technology cannot accurately track and control an ultra-wideband disturbance signal, so that the ultra-wideband EIS accurate measurement cannot be achieved.

In the prior art, the Chinese patent CN115061057A is entitled "Embedded Lithium Battery Impedance Measurement Method and Apparatus Based on Discrete Phase Shift Modulation". However, the control technique proposed in the present disclosure does not perform accurate interference compensation on a phase-shift duty-ratio signal. That is, the given disturbance phase shift duty ratio signal fails to accurately match the influence of an AC disturbance signal on the phase shift duty ratio, resulting in its unsatisfactory tracking effect on an ultra-wideband AC disturbance signal, and the failure to accurately acquire the ultra-wideband EIS of a battery.

The literature "Model Predictive Control for Electrochemical Impedance Spectroscopy Measurement of Fuel Cells Based on Neural Network Optimization" proposes an EIS measurement apparatus based on a model predictive control method. However, this apparatus suffers from complex control implementation and huge computational cost, and cannot accurately track an ultra-wideband AC interference signal, and thus cannot enable ultra-wideband EIS measurements.

SUMMARY

In view of the technical issues present in the prior art, the present disclosure proposes a method to control a battery-power interface converter with an ultra-wideband EIS measurement function. In this method, the battery EIS measurement function is embedded in a battery charging control system based on the battery power interface converter to implement the online and real-time accurate measurements of the ultra-wideband EIS of a battery. The battery charging control system achieves a normal constant-current charging function while operating in a constant-current charging mode, and can accurately track an ultra-wideband hybrid reference current while operating in an EIS measurement mode, thereby achieving accurate EIS measurements within the ultra-wide band.

Since the method for controlling the battery charging power interface converter with the ultra-wideband EIS measurement function proposed in the present disclosure does not require linear links such as an error comparator, and can implement the measurement of ultra-wideband EIS when a switching frequency is high enough.

The EIS measurement function is embedded in a battery charging control system based on a battery-power interface converter according to the method of controlling the battery-power interface converter with ultra-wideband EIS measurement functions. The battery charging control system includes a battery power interface converter, a sampling module, a charging control module, an EIS measurement module, and a driving circuit;

the battery power interface converter adopts a DC-DC converter topology;

the sampling module samples an output current $i_{bat}$ and an output voltage $u_{bat}$ of the battery power interface converter, wherein the output current and output voltage of the battery power interface converter are the battery charging current and the battery charging voltage;

the charging control module includes an operating mode determination circuit, an output current comparator, a duty ratio generator, a duty ratio selector and a PWM circuit;

the operating mode determination circuit determines whether the battery charging control system operates in a constant-current charging mode or in an EIS measurement mode according to the output current $i_{bat}$ and the output voltage $u_{bat}$ of the battery power interface converter;

the output current comparator compares the output current $i_{bat}$ sampled by the current sampling circuit with the output reference current $i_{ref}$ to output a comparison signal $v_c$, and inputs the comparison signal $v_c$ into the duty ratio selector;

the duty ratio generator generates two discrete duty ratio signals $d_H$ and $d_L$ according to the output voltage $u_{bat}$ sampled by the voltage sampling circuit, an output signal of the operating mode determination circuit and a discrete duty ratio function, and inputs the two discrete duty ratio signals $d_H$ and $d_L$ into the duty ratio selector;

in the constant-current charging mode, the discrete duty ratio function is:

$d_H = K_H d_{dc}$, $d_L = K_L d_{dc}$;

in the EIS measurement mode, the discrete duty ratio function is:

$$d_H = K_H d_{dc} + d_{ac}, d_L = K_L d_{dc} + d_{ac};$$

wherein, $d_{dc}=f(U_{in}, u_{bat}, R)$, $d_{ac}=f(U_{in}, i_{ref\_ac}, Z)$ in which, $K_H$ and $K_L$ are two preset constant discrete control parameters; $d_{dc}$ and $d_{ac}$ are a DC duty ratio function and an AC disturbance duty ratio function in a corresponding target duty ratio function, respectively, when the output current $i_{bat}$ of the battery power interface converter accurately tracks a hybrid reference current $I_{ref\_dc}+i_{ref\_ac}$; $U_{in}$ is an input voltage of the battery power interface converter; $u_{bat}$ is an output voltage of the battery power interface converter; $i_{ref\_ac}$ is a sinusoidal AC disturbance reference current; R is a circuit parameter set related to the DC duty ratio function $d_{dc}$ in the battery power interface converter; and Z is a circuit parameter set related to the AC disturbance duty ratio function $d_{ac}$ in the battery power interface converter;

the duty ratio selector selects one of the two discrete duty ratio signals $d_H$ and $d_L$ as an effective duty ratio signal $d_a$ outputted by the duty ratio selector according to the comparison signal $v_c$, and inputs the effective duty ratio signal $d_a$ into the PWM circuit;

the PWM circuit generates a control pulse signal $v_{pl}$ of the power switching device of the battery power interface converter according to the effective duty ratio signal $d_a$ outputted by the duty ratio selector, and inputs the control pulse signal $v_{pl}$ into the driving circuit;

the driving circuit generates a driving signal $v_t$ of the power switching device of the battery power interface converter according to the control pulse signal $v_{pl}$ outputted by the PWM circuit.

Preferably, the EIS measurement module includes an FFT analysis sub-module and an EIS calculation sub-module, and the sampling module includes a current sampling circuit and a voltage sampling circuit.

Preferably, the FFT analysis sub-module is configured to perform FFT analysis on $u_{bat}$ and $i_{bat}$ sampled by the voltage sampling circuit and the current sampling circuit to obtain a voltage amplitude $|u_{bat(ac)}|$, a current amplitude $|i_{bat(ac)}|$, a voltage phase $\varphi_u$ and a current phase $\varphi_i$ of their AC components at a frequency of the sinusoidal AC disturbance reference current $i_{ref\_ac}$;

the EIS calculation sub-module calculates an impedance value of a battery at the frequency of the sinusoidal AC disturbance reference current $i_{ref\_ac}$ according to the amplitude and phase information and functions $|Z_{bat}|=|u_{bat(ac)}|/|i_{bat(ac)}|$ and $\varphi_Z=\varphi_u-\varphi_i$, outputted from the FFT analysis sub-module, in which, $|Z_{bat}|$ is an impedance modulus of a battery impedance, and $\varphi_Z$ is an impedance angle of the battery impedance.

Preferably, the current sampling circuit samples the output current $i_{bat}$ of the battery power interface converter and outputs the output current to the operating mode determination circuit, the FFT analysis sub-module and the output current comparator; and the voltage sampling circuit samples the output voltage $u_{bat}$ of the battery power interface converter and outputs the output voltage to the operating mode determination circuit, the duty ratio generator and the FFT analysis sub-module.

Preferably, a specific method for the operating mode determination circuit to determine whether the battery charging control system operates in the constant-current charging mode or in the EIS measurement mode according to the output current $i_{bat}$ and the output voltage $u_{bat}$ of the battery power interface converter includes:

determining whether they are in a DC steady state according to the output current $i_{bat}$ and the output voltage $u_{bat}$ of the battery power interface converter;

if so, determining that the battery charging control system operates in the constant-current charging mode; and if not, determining whether the ripple peak-to-peak value of the output current $i_{bat}$ is stabilized at a set value, wherein the set value is greater than a peak-to-peak value of the injected sinusoidal AC perturbation reference current $i_{ref}$ ac; if so, determining that the battery charging control system operates in the EIS measurement mode; and if not, determining that the battery charging control system continues to operate in the constant-current charging mode.

Preferably, the constant-current charging mode and the EIS measurement mode are operated in the following ways:

in the constant-current charging mode, the output reference current $i_{ref}$ of the battery power interface converter is equal to a DC charging reference current $I_{ref\_dc}$ of the battery power interface converter, the AC disturbance duty ratio function $d_{ac}$ in the duty ratio generator stops outputting, and the EIS measurement module stops operating; and in the EIS measurement mode, the output reference current $i_{ref}$ of the battery power interface converter is equal to the hybrid reference current $I_{ref\_dc}+i_{ref\_ac}$ of the battery power interface converter, the AC disturbance duty ratio function $d_{ac}$ in the duty ratio generator is normally outputted, and the EIS measurement module starts operating.

Preferably, a specific method for the duty ratio selector to select one of the two discrete duty ratio signals $d_H$ and $d_L$ as an effective duty ratio signal $d_a$ outputted by the duty ratio selector according to the comparison signal $v_c$ includes:

if $i_{bat} < i_{ref}$, selecting the discrete duty ratio signal $d_H$ as an effective duty ratio signal $d_a$ of the current switching cycle, such that the output current of the battery power interface converter rises; and if $i_{bat} > i_{ref}$, selecting the discrete duty ratio signal $d_L$ as the effective duty ratio signal $d_a$ of the current switching cycle, such that the output current of the battery power interface converter drops.

Preferably, when the battery charging control system operate in the constant-current charging mode, the output current $i_{bat}$ of the battery power interface converter can accurately track the DC charging reference current $I_{ref\_dc}$; and when the battery charging control system operates in the EIS measurement mode, the output current $i_{bat}$ of the battery power interface converter can accurately track the hybrid reference current $I_{ref\_dc} + i_{ref\_ac}$, the hybrid reference current being composed of the DC charging reference current $I_{ref\_dc}$ superimposed on the sinusoidal AC disturbance reference current $i_{ref\_ac}$.

The present disclosure has the following beneficial effects.

(1) The battery EIS measurement function is embedded in the battery charging control system to implement the online and real-time accurate measurement of the ultra-wideband EIS of the battery.

(2) A discrete control pulse duty ratio is generated by constructing a target duty ratio function of a reference current, so as to realize accurate tracking of various types of ultra-wideband hybrid reference currents, and then to realize real-time accurate measurement of the ultra-wideband EIS while the battery is controlled to be charged.

(3) The method of the present disclosure has the advantages of simple implementation, low cost, simple and easy control technique, EIS online measurements, ultra-wideband EIS, system stability, strong anti-interference ability, and the like.

DETAILED DESCRIPTION OF THE EMBODIMENTS

In order to make the objectives, technical solutions, and advantages of the present application clearer, the following further describes the present application in detail with reference to the accompanying drawings and the embodiments.

Figure 1:
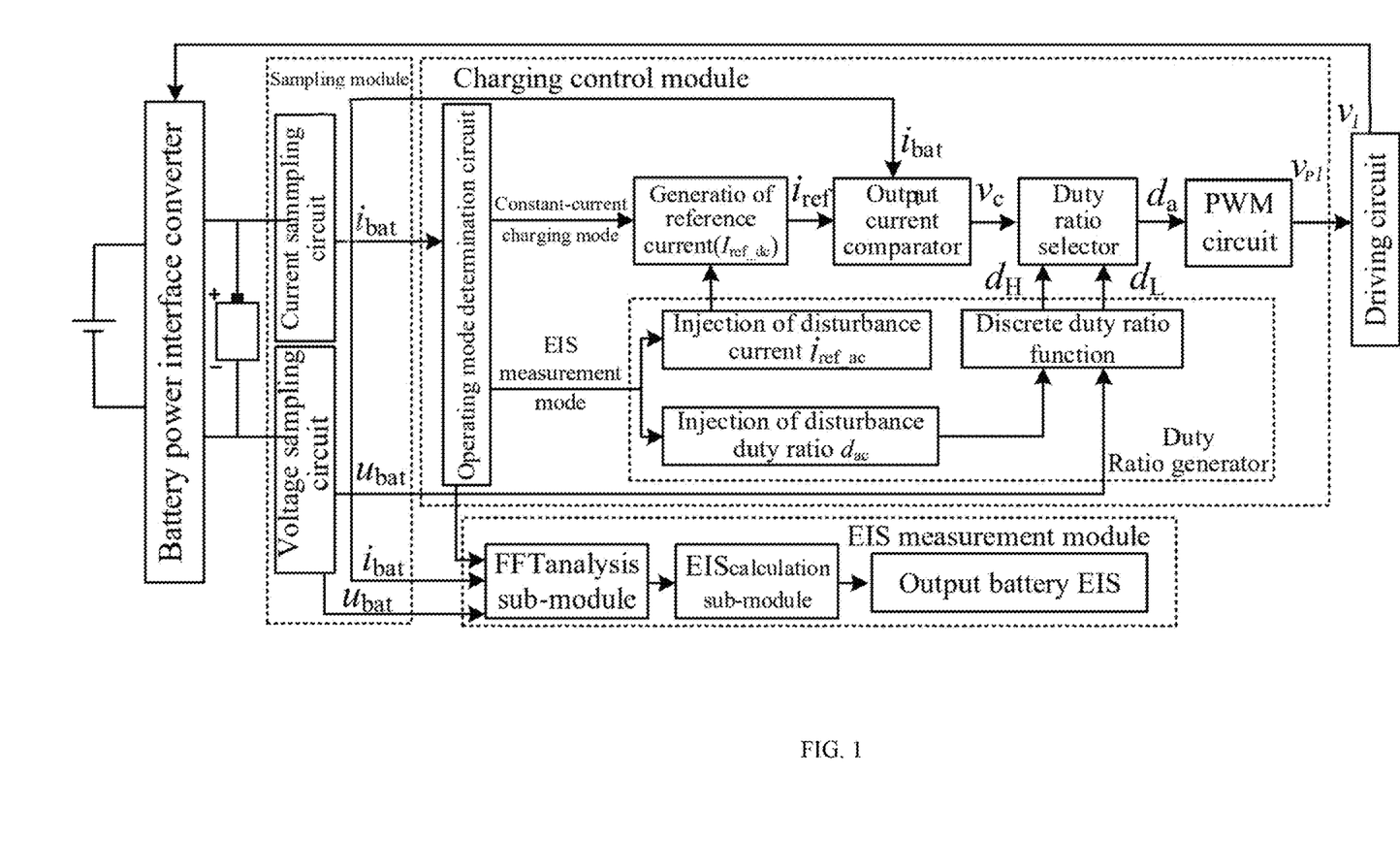
FIG. 1 is a schematic structural diagram of the present disclosure.
Figure 2:
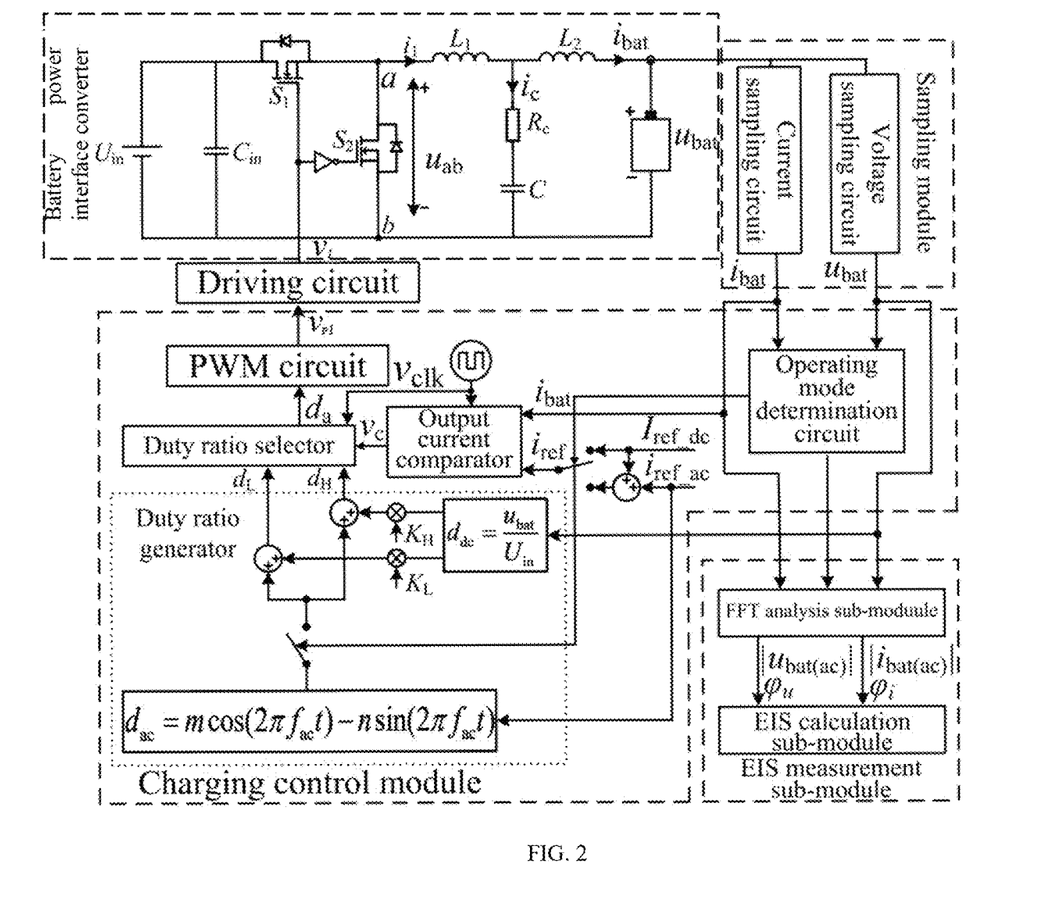
FIG. 2 is a schematic structural diagram of an embodiment of the present disclosure.

As shown in FIG. 1 to FIG. 2, a battery charging apparatus using a method for controlling a battery power interface converter with an ultra-wideband EIS measurement function is provided. The EIS measurement function is embedded in a battery charging control system based on the battery power interface converter. The battery charging control system consists of a battery power interface converter, a sampling module, a charging control module, an EIS measurement module, and a driving circuit;

the battery power interface converter in the present embodiment adopts a buck-boost converter topology to further elaborate the present disclosure;

the sampling module samples an output current $i_{bat}$ and an output voltage $u_{bat}$ of the buck-boost converter, wherein the output current and output voltage of the battery power interface converter are the battery charging current and the battery charging voltage;

the charging control module includes an operating mode determination circuit, an output current comparator, a duty ratio generator, a duty ratio selector and a PWM circuit;

the operating mode determination circuit determines whether the battery charging control system operates in a constant-current charging mode or in an EIS measurement mode according to the output current $i_{bat}$ and the output voltage $u_{bat}$ of the buck-boost converter;

the output current comparator compares the output current $i_{bat}$ sampled by the current sampling circuit with the output reference current $i_{ref}$ to output a comparison signal $v_c$, and inputs the comparison signal $v_c$ into the duty ratio selector;

the duty ratio generator generates two discrete duty ratio signals $d_H$ and $d_L$ according to the output voltage $u_{bat}$ sampled by the voltage sampling circuit, an output signal of the operating mode determination circuit and a discrete duty ratio function, and inputs the two discrete duty ratio signals $d_H$ and $d_L$ into the duty ratio selector;

in the constant-current charging mode, the discrete duty ratio function is:

$d_H = K_H d_{dc}$, $d_L = K_L d_{dc}$;

in the EIS measurement mode, the discrete duty ratio function is:

$$d_H = K_H d_{dc} + d_{ac}, \quad d_L = K_L d_{dc} + d_{ac};$$

$$\text{wherein } d_{dc} = \frac{u_{bat}}{U_{in}}, \quad d_{ac} = m\cos(2\pi f_{ac}t) - n\sin(2\pi f_{ac}t);$$

$$m = \frac{2\pi f_{ac}(L_1 + L_2)I_{ac}}{U_{in}} - \frac{8\pi^3 f_{ac}^3 L_1 L_2 C I_{ac}}{(1 + 4\pi^2 f_{ac}^2 R_C^2 C^2)U_{in}};$$

$$n = \frac{16\pi^4 f_{ac}^4 L_1 L_2 R_C C^2 I_{ac}}{(1 + 4\pi^2 f_{ac}^2 R_C^2 C^2)U_{in}};$$

in which, $K_H$ and $K_L$ are two preset constant discrete control parameters; $d_{dc}$ and $d_{ac}$ are a DC duty ratio function and an AC disturbance duty ratio function in a corresponding target duty ratio function, respectively when the output current $i_{bat}$ of the buck-boost converter accurately tracks a hybrid reference current $I_{ref\_dc} + i_{ref\_ac}$; $U_{in}$ is an input voltage of the buck-boost converter; $u_{bat}$ is an output voltage of the battery power interface converter; $I_{ac}$ is an amplitude of the sinusoidal AC disturbance reference current $i_{ref\_ac}$; and $f_{ac}$ is a frequency of the sinusoidal AC disturbance reference current $i_{ref}$ ac; m is a cosine coefficient that changes with a frequency $f_{ac}$; n is a sine coefficient that changes with the frequency $f_{ac}$. At this time, the circuit parameter set R related to the DC duty cycle function $d_{dc}$ in buck-boost converter is zero; The circuit parameter set Z associated with the AC duty cycle function $d_{ac}$ in the buck-boost converter includes the input inductance $L_1$ of the buck-boost converter, the output inductance $L_2$ of the buck-boost converter, the output capacitance C of the buck-boost converter, and the equivalent capacitance equivalent series resistance $R_c$ on the output side of the buck-boost converter.

the duty ratio selector is configured to select one of the two discrete duty ratio signals $d_H$ and $d_L$ as an effective duty ratio signal da outputted by the duty ratio selector according to the comparison signal $v_c$, and inputs the effective duty ratio signal da into the PWM circuit;

the PWM circuit generates a control pulse signal $v_{pl}$ of the power switching device of the buck-boost converter according to the effective duty ratio signal $d_a$ outputted by the duty ratio selector, and inputs the control pulse signal $v_{pl}$ into the driving circuit;

the driving circuit generates a driving signal $v_l$ of the power switching device of the buck-boost converter according to the control pulse signal $v_{pl}$ outputted by the PWM circuit.

The battery charging control system includes two operating modes: a constant-current charging mode and an EIS measurement mode; and when the battery charging control system operates in the constant-current charging mode, the DC duty ratio function $d_{dc}$ is constructed according to the DC charging reference current $I_{ref\_dc}$. Two sets of discrete duty ratio signals $d_H$ and $d_L$ are designed in advance according to the DC duty ratio function $d_{dc}$, where $d_H=K_H d_{dc}$, $d_L=K_L d_{dc}$.

At the beginning of each switching cycle $T_s$, the output current $i_{bat}$ of the buck-boost converter is sampled by the current sampling circuit, and the output current comparator compares the output current $i_{bat}$ of the buck-boost converter with the DC charging reference current $I_{ref\_dc}$. According to the comparison result, an appropriate duty ratio signal is selected from the two discrete duty ratio signals $d_H$ and $d_L$ as an effective duty ratio signal $d_a$ of the current switching cycle. In addition, a control pulse signal $v_{pl}$ of a power switching device of the buck-boost converter is generated according to the effective duty ratio signal $d_a$. In a case of $i_{bat}<I_{ref\_dc}$ and the effective duty ratio signal $d_a=d_H$, a controller allows an output current of the buck-boost converter to rise by outputting a larger duty ratio; and in a case of $i_{bat}\geq I_{ref\_dc}$ and the effective duty ratio signal $d_a=d_L$, the controller allows the output current of the buck-boost converter to drop by outputting a smaller duty ratio.

When the battery charging control system operates in the EIS measurement mode, the controller injects a sinusoidal AC disturbance reference current $i_{ref\_ac}$ into the DC charging reference current $I_{ref\_dc}$. At the same time, the AC disturbance duty ratio function $d_{ac}$ which matches the sinusoidal AC disturbance reference current $i_{ref}$ ac is injected into two sets of discrete duty ratio signals $d_H$ and $d_L$. Therefore, the output reference current of the buck-boost converter turns to $I_{ref\_dc}+i_{ref\_ac}$, and the two sets of discrete duty ratio signals $d_H$ and $d_L$ turn to $d_H=K_H d_{dc}+d_{ac}$ and $d_L=K_L d_{dc}+d_{ac}$, respectively.

At the beginning of each switching cycle $T_s$, the output current $i_{bat}$ of the buck-boost converter is sampled by the current sampling circuit, and the output current comparator compares the output current $i_{bat}$ of the buck-boost converter with the hybrid reference current $I_{ref\_dc}+i_{ref\_ac}$. According to the comparison result, an appropriate duty ratio signal is selected from the two discrete duty ratio signals $d_H$ and $d_L$ as an effective duty ratio signal $d_a$ of the current switching cycle. In addition, a control pulse signal $v_{pl}$ of a power switching device of the buck-boost converter is generated according to the effective duty ratio signal $d_a$. In a case of $i_{bat}<I_{ref\_dc}+i_{ref\_ac}$ and the effective duty ratio signal $d_a=d_H$, the controller allows the output current of the buck-boost converter to rise by outputting a larger duty ratio; and in a case of $i_{bat}>I_{ref\_dc}+i_{ref\_ac}$ and the effective duty ratio signal $d_a=d_L$, the controller allows the output current of the buck-boost converter to drop by outputting a smaller duty ratio. The $K_H$ and $K_L$ are two preset constant discrete control parameters. In order for the resulting effective duty ratio signal $d_a$ to satisfy $0<d_a<1$, $K_H$ and $K_L$ need to satisfy: $-d_a/d_{dc}<K_L<1<K_H<(1-d_{ac})/d_{dc}$. In the EIS measurement mode, the output current (i.e., battery charging current) of the buck-boost converter can accurately and rapidly fit an ultra-wideband reference current signal in real time. According to the present disclosure, the battery charging current $i_{bat}$ and the battery charging voltage $u_{bat}$ can be sampled, and the results of the ultra-wideband EIS measurements of the battery can be obtained by the FFT analysis sub-module and the EIS computation sub-module.

Time-domain simulated analysis is performed in this embodiment of the present disclosure, wherein the battery power interface converter adopts a buck-boost converter topology structure. The main circuit parameters of the buck-boost converter are: an input voltage, $U_{in}=12V$; an input side inductance, $L_1=100$ µH; an output side inductance, $L_2=22$ µH; a switching frequency, $f_s=500$ kHz; an output side filter capacitance, $C=470$ µF; an equivalent series resistance of the output side filter capacitor, $R_c=0.5\Omega$; a nominal voltage of a lithium battery, $V_{bat}=3.6V$; a DC charging reference current of the lithium battery, $I_{ref}=0.975$ A; and an amplitude of the sinusoidal AC disturbance reference current, $I_{ac}=0.05$ A. The simulation results are as follows.

Figure 3:
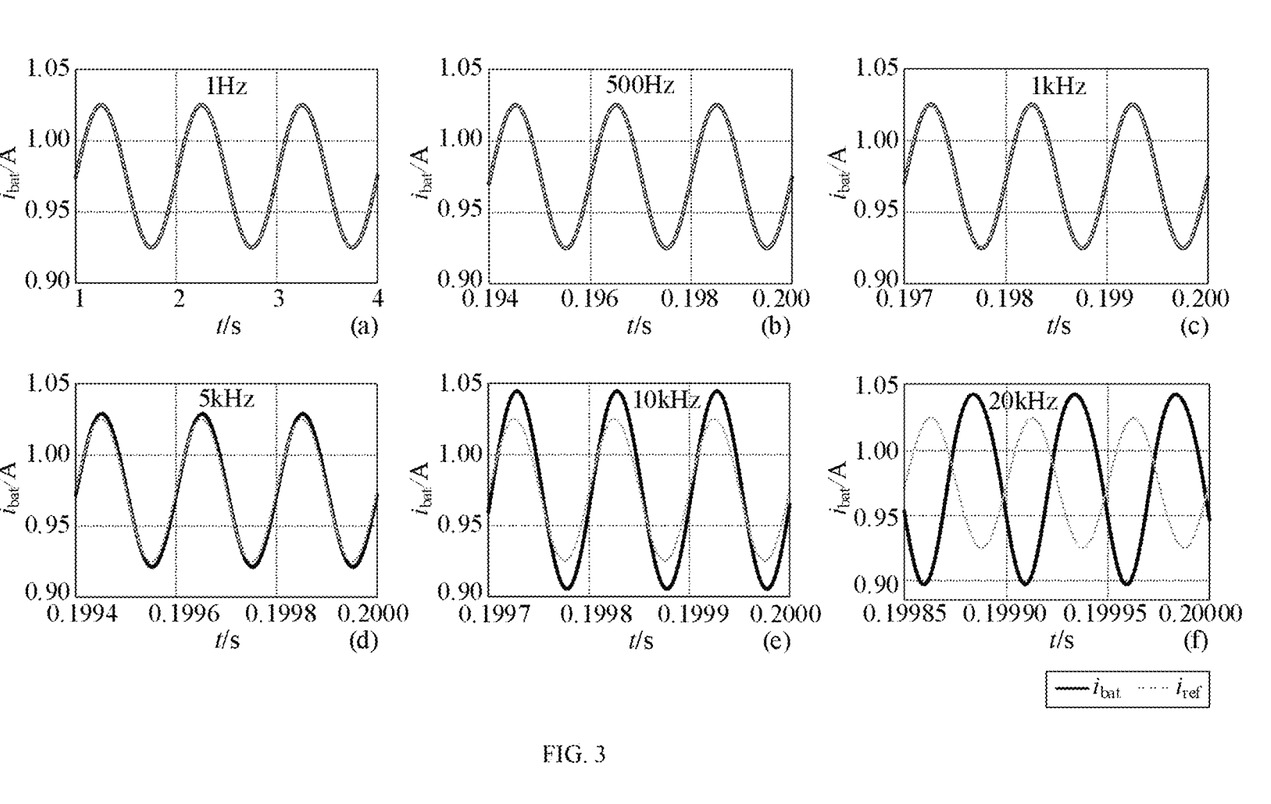
FIG. 3 is a simulated waveform diagram of an output current $i_{bat}$ of a buck-boost converter and its hybrid reference current $I_{ref\_dc} + i_{ref\_ac}$ when a battery charging control system in an embodiment of the present disclosure adopts a traditional PI control method and operates in an EIS measurement mode.

FIG. 3 is a simulated waveform diagram of an output current $i_{bat}$ of a buck-boost converter and its output reference current $i_{ref}=I_{ref\_dc}+i_{ref\_ac}$ (i.e., the hybrid reference current) when a battery charging control system in an embodiment of the present disclosure adopts a traditional PI control method and operates in an EIS measurement mode. The sinusoidal AC disturbance reference currents corresponding to the respective figures each have an amplitude $I_{ac}$ of 0.05 A, and have the frequencies of: 1 Hz in (a), 500 Hz in (b), 1 kHz in (c), 5 kHz in (d), 10 kHz in (e), and 20 kHz in (f), respectively.

Figure 4:
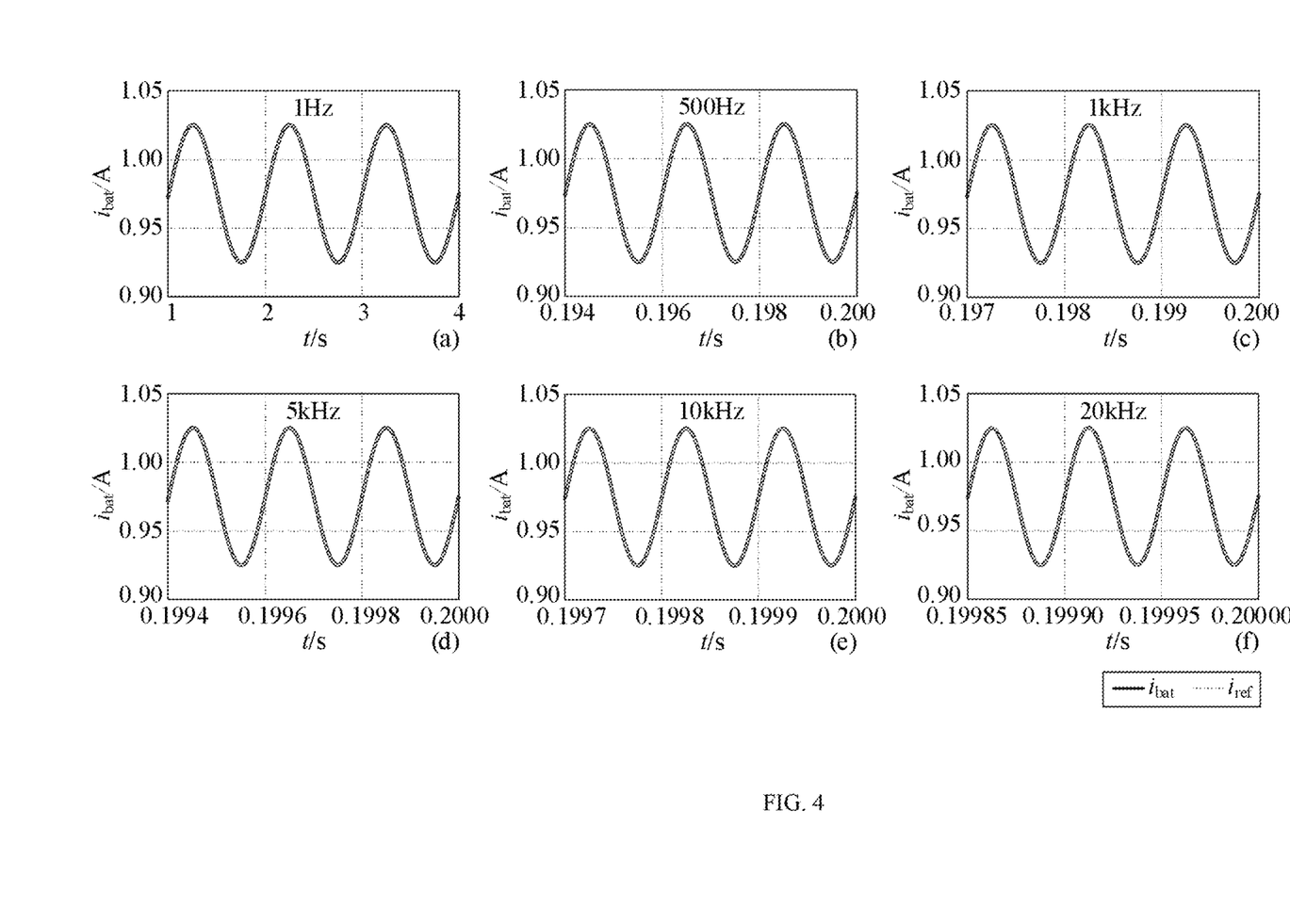
FIG. 4 is a simulated waveform diagram of an output current $i_{bat}$ of a buck-boost converter and its hybrid reference current $I_{ref\_dc} + i_{ref\_ac}$ when a battery charging control system in an embodiment of the present disclosure adopts a control method of the present disclosure and operates in an EIS measurement mode.

FIG. 4 is a simulated waveform diagram of an output current $i_{bat}$ of a buck-boost converter and its output reference current $i_{ref}=I_{ref\_dc}+i_{ref\_ac}$ (i.e., the hybrid reference current) when a battery charging control system in an embodiment of the present disclosure adopts the method of the present disclosure and operates in an EIS measurement mode. The sinusoidal AC disturbance reference currents corresponding to the respective figures each have an amplitude $I_{ac}$ of 0.05 A, and have the frequencies of: 1 Hz in (a), 500 Hz in (b), 1 kHz in (c), 5 kHz in (d), 10 kHz in (e), and 20 kHz in (f), respectively.

As can be seen from FIG. (a) to FIG. (f) in FIG. 3 and FIG. (a) to FIG. (f) in FIG. 4, in this embodiment of the present disclosure, when the battery charging control system adopts the traditional PI control method, the output current $i_{bat}$ of the buck-boost converter can accurately track the hybrid reference current $I_{ref\_dc}+i_{ref\_ac}$ at 1 Hz, 500 Hz and 1 kHz, but cannot accurately track the hybrid reference current $I_{ref\_dc}+i_{ref\_ac}$ at ultra-wide frequencies of 5 kHz, 10 kHz and 20 kHz; and when the battery charging control system adopts the control method of the present disclosure, the output current $i_{bat}$ of the buck-boost converter can achieve high-precision tracking effects for the hybrid reference current $I_{ref\_dc}+i_{ref\_ac}$ at 1 Hz, 500 Hz, 1 kHz, 5 kHz, 10 kHz and 20 kHz. This shows that for the battery charging control system, in an ultra-wide band, the effect achieved in response to using the control method of the present disclosure is better than the effect achieved in response to using the traditional PI control method.

In this embodiment of the present disclosure, the buck-boost converter is used as the battery power interface converter. A discrete pulse control method based on discrete pulse modulation is adopted, which, by generating two discrete duty ratio signals and according to a relationship between an output current and a reference current, selects an appropriate duty ratio signal from the two duty ratio signals to generate a control pulse signal of a power switching device of the buck-boost converter and to act on the buck-boost converter. The method of the present disclosure achieves accurate tracking of the output current of the buck-boost converter to the DC charging or hybrid reference current. The battery charging control system can achieve a normal constant-current charging function while operating in the constant-current charging mode, and can accurately track an ultra-wideband hybrid reference current of the output current of the buck-boost converter while operating in the EIS measurement mode, thereby achieving the ultra-wideband EIS accurate measurement of the battery.

The basic principles and main features of the present disclosure and the advantages of the present disclosure have been shown and described above. Those skilled in the art should understand that the present disclosure is not limited by the aforementioned embodiments. The foregoing embodiments and descriptions described in the specification only illustrate the principle of the present disclosure. Without departing from the spirit and scope of the present disclosure, the present disclosure will have various changes and improvements, and these changes and improvements fall into the claimed disclosure. The protection scope of the present disclosure is defined by the appended claims and their equivalents.

What is claimed is:

1. A method for controlling a battery power interface converter with an ultra-wideband Electrochemical Impedance Spectroscopy (EIS) measurement function, wherein the battery EIS measurement function is embedded in a charging control system of a battery power interface, the charging control system of the battery power interface comprising the battery power interface converter, a sampling module, a charging control module, an EIS measurement module, and a driving circuit;

the battery power interface converter adopts a DC-DC converter topology;

the sampling module samples an output current $i_{bat}$ and an output voltage $u_{bat}$ of the battery power interface converter, wherein the output current and output voltage of the battery power interface converter are the battery charging current and the battery charging voltage;

the charging control module comprises an operating mode determination circuit, an output current comparator, a duty ratio generator, a duty ratio selector and a PWM circuit;

the operating mode determination circuit determines whether the battery charging control system is operating in a constant-current charging mode or in an EIS measurement mode according to the output current $i_{bat}$ and the output voltage $u_{bat}$ of the battery power interface converter;

the output current comparator compares the output current $i_{bat}$ sampled by the current sampling circuit with the output reference current $i_{ref}$ to output a comparison signal $v_c$, and inputs the comparison signal $v_c$ into the duty ratio selector;

the duty ratio generator generates two discrete duty ratio signals $d_H$ and $d_L$ according to the output voltage $u_{bat}$, an output signal of the operating mode determination circuit and a discrete duty ratio function, and inputs the two discrete duty ratio signals $d_H$ and $d_L$ into the duty ratio selector;

in the constant-current charging mode, the discrete duty ratio function is:

$d_H = K_H d_{dc}$, $d_L = K_L d_{dc}$;

in the EIS measurement mode, the discrete duty ratio function is:

$$d_H = K_H d_{dc} + d_{ac}, d_L = K_L d_{dc} + d_{ac};$$

wherein, $d_{dc}=f(U_{in}, u_{bat}, R)$, $d_{ac}=f(U_{in}, i_{ref\_ac}, Z)$;

in which, $K_H$ and $K_L$ are two preset constant discrete control parameters; $d_{dc}$ and $d_{ac}$ are a DC duty ratio function and an AC disturbance duty ratio function in a corresponding target duty ratio function, respectively, when the output current $i_{bat}$ of the battery power interface converter accurately tracks a hybrid reference current $I_{ref\_dc}+i_{ref\_ac}$; $U_{in}$ is an input voltage of the battery power interface converter; $u_{bat}$ is an output voltage of the battery power interface converter; $i_{ref\_ac}$ is a sinusoidal AC disturbance reference current, $I_{ref\_dc}$ is a DC charging reference current of the battery power interface converter; R is a circuit parameter set related to the DC duty ratio function $d_{dc}$ in the battery power interface converter; and Z is a circuit parameter set related to the AC disturbance duty ratio function $d_{ac}$ in the battery power interface converter;

the duty ratio selector selects one of the two discrete duty ratio signals $d_H$ and $d_L$ as an effective duty ratio signal $d_a$ outputted by the duty ratio selector according to the comparison signal $v_c$, and inputs the effective duty ratio signal $d_a$ into the PWM circuit;

the PWM circuit generates a control pulse signal $v_{pl}$ of the power switching device of the battery power interface converter according to the effective duty ratio signal $d_a$, and inputs the control pulse signal $v_{pl}$ into the driving circuit;

the driving circuit generates a driving signal $v_l$ of the power switching device of the battery power interface converter according to the control pulse signal $v_{pl}$.

2. The method for controlling the battery power interface converter with the ultra-wideband EIS measurement function according to claim 1, wherein the EIS measurement module comprises an FFT analysis sub-module and an EIS calculation sub-module, and the sampling module comprises a current sampling circuit and a voltage sampling circuit.

3. The method for controlling the battery power interface converter with the ultra-wideband EIS measurement function according to claim 2, wherein the FFT analysis sub-module is configured to perform FFT analysis on $u_{bat}$ and $i_{bat}$ sampled by the voltage sampling circuit and the current sampling circuit to obtain a voltage amplitude $|u_{bat\_(ac)}|$, a current amplitude $|i_{bat(ac)}|$, a voltage phase $\varphi_u$ and a current phase $\varphi_i$ of their AC components at a frequency of the sinusoidal AC disturbance reference current $i_{ref\_ac}$;

the EIS calculation sub-module calculates an impedance value of a battery at the frequency of the sinusoidal AC disturbance reference current $i_{ref\_ac}$ according to the amplitude and phase information and functions $|Z_{bat}|=u_{bat\_(ac)}|/i_{bat(ac)}|$ and $\varphi_Z=\varphi_u-\varphi_i$ Outputted from the FFT Analysis Sub-module, in which, $|Z_{bat}|$ is an impedance modulus of a battery impedance, and $\varphi_Z$ is an impedance angle of the battery impedance.

4. The method for controlling the battery power interface converter with the ultra-wideband EIS measurement function according to claim 2, wherein the current sampling circuit samples the output current $i_{bat}$ of the battery power interface converter and outputs the output current to the operating mode determination circuit, the FFT analysis sub-module and the output current comparator; and the voltage sampling circuit samples the output voltage $u_{bat}$ of the battery power interface converter and outputs the output voltage to the operating mode determination circuit, the duty ratio generator and the FFT analysis sub-module.

5. The method for controlling the battery power interface converter with the ultra-wideband EIS measurement function according to claim 1, wherein a specific method for the operating mode determination circuit to determine whether the battery charging control system operates in the constant-current charging mode or in the EIS measurement mode according to the output current $i_{bat}$ and the output voltage $u_{bat}$ comprises:

determining whether they are in a DC steady state according to the output current $i_{bat}$ and the output voltage $u_{bat}$ of the battery power interface converter;

if so, determining that the battery charging control system operates in the constant-current charging mode; and if not, determining whether the ripple peak-to-peak value of the output current $i_{bat}$ is stabilized at a set value, wherein the set value is greater than a peak-to-peak value of the injected sinusoidal AC disturbance reference current $i_{ref\_ac}$; if so, determining that the battery charging control system operates in the EIS measurement mode; and if not, determining that the battery charging control system continues to operate in the constant-current charging mode.

6. The method for controlling the battery power interface converter with the ultra-wideband EIS measurement function according to claim 5, wherein the constant-current charging mode and the EIS measurement mode are operated in the following ways:

in the constant-current charging mode, the output reference current $i_{ref}$ of the battery power interface converter is equal to the DC charging reference current $I_{ref\_dc}$ of the battery power interface converter, the AC disturbance duty ratio function $d_{ac}$ in the duty ratio generator stops outputting, and the EIS measurement module stops operating; and in the EIS measurement mode, the output reference current $i_{ref}$ of the battery power interface converter is equal to the hybrid reference current $I_{ref\_dc}+i_{ref\_ac}$ of the battery power interface converter, the AC disturbance duty ratio function $d_{ac}$ in the duty ratio generator is normally outputted, and the EIS measurement module starts operating.

7. The method for controlling the battery power interface converter with the ultra-wideband EIS measurement function according to claim 1, wherein a specific method for the duty ratio selector to select one of the two discrete duty ratio signals $d_H$ and $d_L$ as the effective duty ratio signal $d_a$ outputted by the duty ratio selector according to the comparison signal $v_c$ is as follows:

when the battery charging control system operates in the constant-current charging mode, at the beginning of each switching cycle $T_s$, the output current $i_{bat}$ of the battery power interface converter is sampled by the sampling module, and the output current comparator compares the output current $i_{bat}$ of the battery power interface converter with the DC charging reference current $I_{ref\_dc}$; according to a comparison result, an appropriate duty ratio signal is selected from the two discrete duty ratio signals $d_H$ and $d_L$ as an effective duty ratio signal $d_a$ of the current switching cycle; a control pulse signal $v_{pl}$ of the power switching device of the battery power interface converter is generated according to the effective duty ratio signal $d_a$; in a case of $i_{bat}<I_{ref\_dc}$ and the effective duty ratio signal $d_a=d_H$, the controller allows the output current of the battery power interface converter to rise by outputting a larger duty ratio signal; in a case of $i_{bat}>I_{ref\_dc}$ and the effective duty ratio signal $d_a=d_L$, the controller allows the output current of the battery power interface converter to drop by outputting a smaller duty ratio signal;

when the battery charging control system operates in the EIS measurement mode, the controller injects a sinusoidal AC disturbance reference current $i_{ref\_ac}$ into the DC charging reference current $I_{ref\_dc}$; at the same time, the AC disturbance duty ratio signal $d_{ac}$ which matches the sinusoidal AC disturbance reference current $i_{ref}$ ac is injected into the two discrete duty ratio signals $d_H$ and $d_L$; accordingly, the output reference current of the battery power interface converter turns to $I_{ref\_dc}+i_{ref\_ac}$, and the two discrete duty ratio signals $d_H$ and $d_L$ turn to $d_H=K_H d_{dc}+d_{ac}$ and $d_L=K_L d_{dc}+d_{ac}$, respectively;

at the beginning of each switching cycle $T_s$, the output current $i_{bat}$ of the battery power interface converter is sampled by the sampling module, and the output current comparator compares the output current $i_{bat}$ of the battery power interface converter with the hybrid reference current $I_{ref\_dc}+i_{ref\_ac}$; according to a comparison result, an appropriate duty ratio signal is selected from the two discrete duty ratio signals $d_H$ and $d_L$ as an effective duty ratio signal $d_a$ of the current switching cycle; a control pulse signal $v_{pl}$ of the power switching device of the battery power interface converter is generated according to the effective duty ratio signal $d_a$; in a case of $i_{bat}<I_{ref\_dc}+i_{ref\_ac}$ and the effective duty ratio signal $d_a=d_H$, the controller allows the output current of the battery power interface converter to rise by outputting a larger duty ratio signal; in a case of $i_{bat}\geq I_{ref\_dc}+i_{ref\_ac}$ and the effective duty ratio signal $d_a=d_L$, the controller allows the output current of the battery power interface converter to drop by outputting a smaller duty ratio signal; the $K_H$ and $K_L$ are two preset constant discrete control parameters; and in order for the resulting effective duty ratio signal $d_a$ to satisfy $0<d_a<1$, $K_H$ and $K_L$ need to satisfy $$-d_{ac}/d_{dc} < K_L < 1 < K_H < (1-d_{ac})/d_{dc}.$$

8. The method for controlling the battery power interface converter with the ultra-wideband EIS measurement function according to claim 1, wherein when the battery charging control system operate in the constant-current charging mode, the output current $i_{bat}$ of the battery power interface converter can accurately track the DC charging reference current $I_{ref\_dc}$; and when the battery charging control system operates in the EIS measurement mode, the output current $i_{bat}$ of the battery power interface converter can accurately track the hybrid reference current $I_{ref\_dc}+i_{ref\_ac}$, the hybrid reference current being composed of the DC charging reference current $I_{ref\_dc}$ superimposed on the sinusoidal AC disturbance reference current $i_{ref}$ ac.

* * * * *